United States Patent
Ozaki et al.

(10) Patent No.: US 9,863,534 B2
(45) Date of Patent: Jan. 9, 2018

(54) HARD CARBON COATING FILM

(71) Applicant: NIPPON PISTON RING CO., LTD., Saitama-shi, Saitama (JP)

(72) Inventors: Takuya Ozaki, Saitama (JP); Hiroyuki Sugiura, Saitama (JP)

(73) Assignee: NIPPON PISTON RING CO., LTD., Saitama-shi, Saitama (JP)

( * ) Notice: Subject to any disclaimer, the term of this patent is extended or adjusted under 35 U.S.C. 154(b) by 167 days.

(21) Appl. No.: 14/768,786

(22) PCT Filed: Feb. 27, 2014

(86) PCT No.: PCT/JP2014/054927
§ 371 (c)(1),
(2) Date: Aug. 19, 2015

(87) PCT Pub. No.: WO2014/133095
PCT Pub. Date: Sep. 4, 2014

(65) Prior Publication Data
US 2016/0003356 A1    Jan. 7, 2016

(30) Foreign Application Priority Data
Feb. 28, 2013    (JP) .................................. 2013-038322

(51) Int. Cl.
*F16J 9/28*    (2006.01)
*F16J 9/26*    (2006.01)
(Continued)

(52) U.S. Cl.
CPC .............. *F16J 9/28* (2013.01); *C23C 14/0605* (2013.01); *C23C 14/325* (2013.01); *F16J 9/26* (2013.01)

(58) Field of Classification Search
USPC ........ 277/440, 443, 444; 428/336, 408, 457, 428/698; 123/193.6
See application file for complete search history.

(56) References Cited

U.S. PATENT DOCUMENTS 6,325,385 B1 * 12/2001 Iwashita ............... F16J 9/26
                                                       277/442
7,406,940 B2 * 8/2008 Nishimura ........... C10M 145/08
                                                       123/193.6
(Continued)

FOREIGN PATENT DOCUMENTS

EP    2505685 A1    10/2012
JP    2006-057674 A    3/2006
(Continued)

OTHER PUBLICATIONS

International Search Report for PCT/JP2014/054927 dated Apr. 28, 2014 [PCT/ISA/210].
(Continued)

*Primary Examiner* — Archene Turner
(74) *Attorney, Agent, or Firm* — Sughrue Mion, PLLC

(57) ABSTRACT

A piston ring having a hard carbon coating film is provided that can be easily formed in the same batch, does not cause delamination, and is excellent in initial running-in and wear resistance.
A hard carbon coating film is formed at least on an outer peripheral sliding surface of a piston ring base and contains substantially no hydrogen, wherein the hard carbon coating film has an $sp^2$ content ratio ranging from 40% to 80% measured in a TEM-EELS spectrum where transmission electron microscopy (TEM) and electron energy-loss spectroscopy (EELS) are combined together, and an area ratio of contained macro particles on a surface of the hard carbon coating film ranges from 0.1% to 10.0%.

8 Claims, 9 Drawing Sheets

(51) Int. Cl.
    *C23C 14/06*     (2006.01)
    *C23C 14/32*     (2006.01)

(56) References Cited

U.S. PATENT DOCUMENTS

| | | | | |
|---|---|---|---|---|
| 2007/0224349 | A1* | 9/2007 | Hosenfeldt | C23C 14/024 428/688 |
| 2012/0248711 | A1* | 10/2012 | Iwashita | C23C 14/0605 277/440 |
| 2013/0140776 | A1* | 6/2013 | Kennedy | C23C 14/025 277/442 |

FOREIGN PATENT DOCUMENTS

| | | |
|---|---|---|
| JP | 2008-297477 A | 12/2008 |
| JP | 2010-202945 A | 9/2010 |
| JP | 2012-202522 A | 10/2012 |
| JP | 2012-527581 A | 11/2012 |

OTHER PUBLICATIONS

Edwin H. T., et al., Department of Materials Science and Engineering, Thermal stability of nonhydrogenated multilayer amorphous carbon prepared by the filtered cathodic vacuum arc technique.
M. Hakovirta, et al., Diamond and Related Materials 4 (1995) 1335-1339, Graphite Particles in the diamond-like a-C films prepared with the pulsed arc-discharge method.

\* cited by examiner

FIG.2
(a)
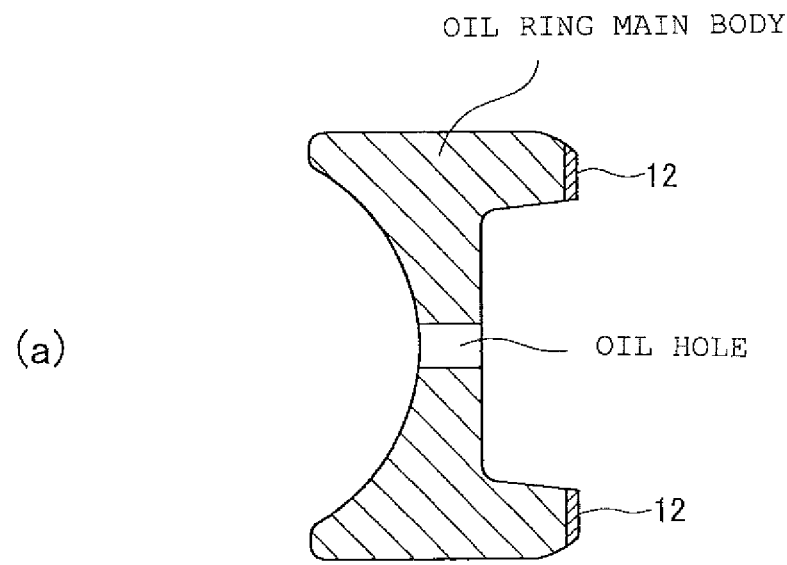
(b)
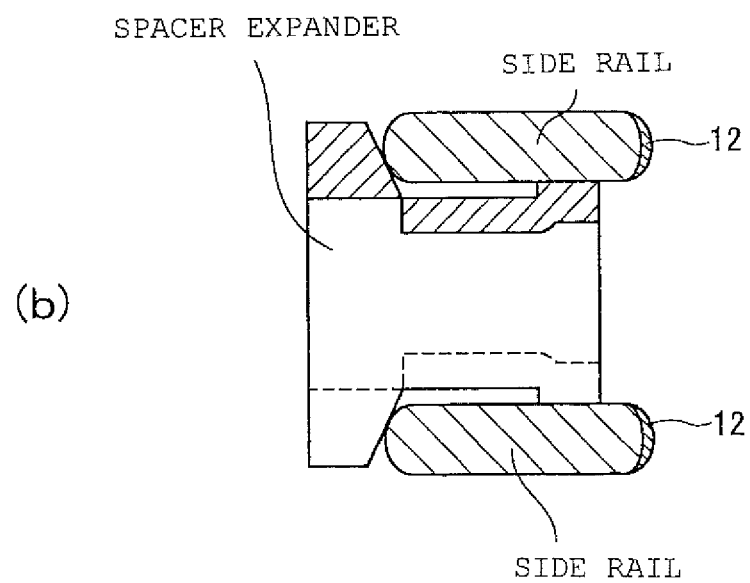

FIG.8
(a)
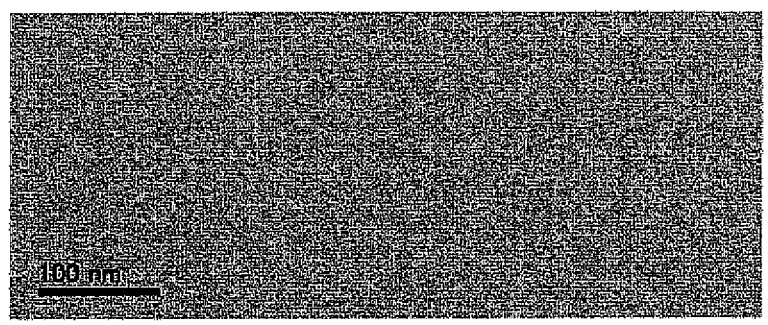
(b)

FIG. 9
(a)
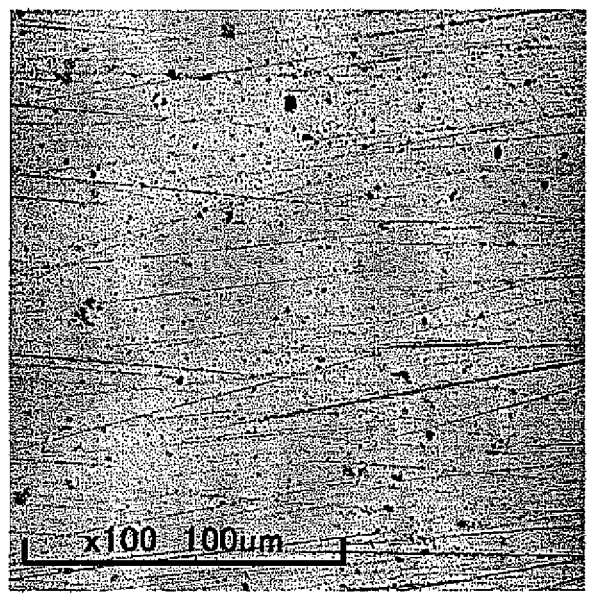
(b)
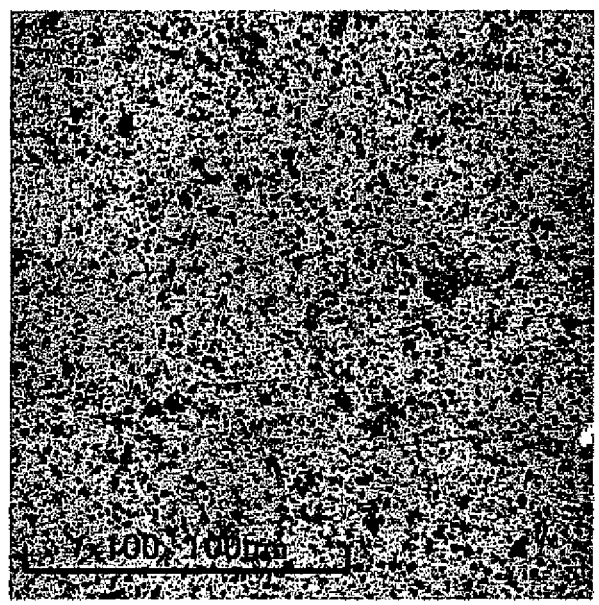

HARD CARBON COATING FILM

CROSS REFERENCE TO RELATED APPLICATIONS

This application is a National Stage of International Application No. PCT/JP2014/054927 filed Feb. 27, 2014, claiming priority based on Japanese Patent Application No. 2013-038322 filed Feb. 28, 2013, the contents of all of which are incorporated herein by reference in their entirety.

TECHNICAL FIELD

The present invention relates to a hard carbon coating film and, in particular, to a hard carbon coating film that has high adhesion in a hard carbon coating film layer, and favorable initial running-in and wear resistance.

BACKGROUND ART

Conventionally, various hard carbon coating films have been known that are formed on sliding surfaces of sliding members, such as piston rings, and have low friction and wear resistance.

The following Patent Literature 1 describes a hard carbon coating film of a piston ring which has a carbon-based coating formed over its sliding surface, wherein the coating is a multilayer coating including two types of layers having different hardnesses laminated in at least two layers, a hardness difference between the two types of layers is 500 to 1700 HV, a high hardness layer has a thickness identical to or greater than that of a low hardness layer, and the coating as a whole has a thickness of 5.0 μm or more.

The following Patent Literature 2 discloses a DLC coating of a sliding element for an internal combustion engine, particularly a piston ring, including a ta-C type DLC coating wherein the residual stress varies over the thickness of the coating to define at least one residual stress gradient.

CITATION LIST

Patent Literature

[Patent Literature 1] Japanese Patent Laid-Open No. 2012-202522
[Patent Literature 2] Japanese Patent Laid-Open No. 2012-527581

SUMMARY OF INVENTION

Technical Problem

Although the hard carbon coating film described in Patent Literature 1 has the configuration where the multiple hard carbon coating films having different hardness are laminated to allow the film thickness to be large, the thickness of a layer having high hardness ranging from 5 to 90 nm cannot always allow a film having high hardness to be maintained on the outermost surface. There is thus a problem in that the wear resistance is inferior. Furthermore, there is a possibility of causing delamination. Formation of a multilayer lamination structure complicates a manufacturing process. Thus, a problem occurs in that it is difficult to achieve easy manufacturing.

Although the hard carbon coating film described in Patent Literature 2 can be formed to have a large layer thickness, the residual stress varies over the coating film and at least one residual stress gradient is required to be formed. Thus, a problem occurs in that it is difficult to achieve easy manufacturing.

The present invention has been made in view of the above problems, and has an object to provide a hard carbon coating film that has high adhesion in a hard carbon coating film layer, and favorable initial running-in and wear resistance, and can be formed to have a desired film thickness through a simple manufacturing method.

Solution to Problem

A hard carbon coating film according to the present invention is formed at least on an outer peripheral sliding surface of a piston ring base and contains substantially no hydrogen, wherein the hard carbon coating film has an $sp^2$ content ratio ranging from 40% to 80% measured in a TEM-EELS spectrum where transmission electron microscopy (TEM) and electron energy-loss spectroscopy (EELS) are combined together, and an area ratio of contained macro particles on a surface of the hard carbon coating film ranges from 0.1% to 10.0%.

Preferably, the hard carbon coating film according to the present invention is formed by a step of changing an intensity of arc current, the step including a first film forming step of performing treatment at an arc current ranging from 60 to 100 A and a pulse bias voltage ranging from −2000 to −800 V, and a second film forming step of performing treatment at an arc current ranging from 100 to 150 A and a pulse bias voltage ranging from −2000 to −800 V.

Preferably, the hard carbon coating film according to the present invention includes a surface layer nanolaminate portion observed to have a striped coating film section on an outermost surface by the transmission electron microscopy (TEM).

Preferably, in the hard carbon coating film according to the present invention, the surface layer nanolaminate portion further includes an outermost surface film forming step of repeating a high voltage treatment at a pulse bias voltage ranging from −2000 to −800 V and a low voltage treatment at a pulse bias voltage ranging from −200 to −100 V multiple times at predetermined intervals after the second film forming step.

Preferably, as to the hard carbon coating film according to the present invention, an underlayer including Ti, Cr or Si is provided under the hard carbon coating film.

Preferably, as to the hard carbon coating film according to the present invention, a substrate layer including any of a PVD coating film, a Cr plating coating film and a nitrided layer is formed between the underlayer and the piston ring base.

Preferably, the hard carbon coating film according to the present invention has a surface roughness of an initial wear height Rpk according to DIN 4776 standards of 0.2 μm or smaller.

Preferably, the hard carbon coating film according to the present invention is formed to have a film thickness of at least 5 μm.

Preferably, the hard carbon coating film according to the present invention is formed to have a film thickness of at least 0.5 μm and less than 5 μm.

Advantageous Effects of Invention

In the hard carbon coating film according to the present invention, the $sp^2$ content ratio measured in the TEM-EELS spectrum where transmission electron microscopy (TEM) and electron energy-loss spectroscopy (EELS) are combined together ranges from 40% to 80%, and the area ratio of contained macro particles on the surface of the hard carbon coating film ranges from 0.1% to 10.0%. Consequently, the hard carbon coating film excellent in wear resistance can be formed. Furthermore, since the area ratio of contained macro particles on the surface of the hard carbon coating film ranges from 0.1% to 10.0%, the surface irregularities become small. As a result, such irregularities can negate the need of a surface smoothing process to be performed as the final process, for example, lapping, buffing or the like, and provide a piston ring having the above characteristics at low cost.

The hard carbon coating film according to the present invention is formed by an ion plating method that includes a first film forming step of performing treatment at an arc current ranging from 60 to 100 A and a pulse bias voltage ranging from −2000 to −800 V, and a second film forming step of performing treatment at an arc current ranging from 100 to 150 A and a pulse bias voltage ranging from −2000 to −800 V. Consequently, the treatment can be performed in the same batch, and the hard carbon coating film that has high adhesion in the hard carbon coating film layer and favorable wear resistance can be easily formed. The first film forming step can reduce nucleation of macro particles and also reduce nucleus growth. As a result, the second film forming step can prevent increase of macro particles, form a flat film having small surface irregularities, thereby allowing the initial running-in and wear resistance to be improved.

The hard carbon coating film according to the present invention includes a surface layer nanolaminate portion observed to have a striped coating film section on an outermost surface by the transmission electron microscopy (TEM). Consequently, the toughness and wear resistance can be improved.

The hard carbon coating film according to the present invention further includes an outermost surface film forming step of repeating a high voltage treatment at a pulse bias voltage ranging from −2000 to −800 V and a low voltage treatment at a pulse bias voltage ranging from −200 to −100 V multiple times at predetermined intervals after the second film forming step. Consequently, the toughness and wear resistance of the surface of the hard carbon coating film can be improved, and cracking and chipping can be prevented.

As to the hard carbon coating film according to the present invention, an underlayer including Ti, Cr or Si is provided under the hard carbon coating film. Consequently, the adhesion of the hard carbon coating film can be improved.

As to the hard carbon coating film according to the present invention, a substrate layer including any of a PVD coating film, a Cr plating coating film and a nitrided layer is formed between the underlayer and the piston ring base. Consequently, the adhesion of the hard carbon coating film can be improved.

The hard carbon coating film according to the present invention has a surface roughness of an initial wear height Rpk according to DIN 4776 standards of 0.2 μm or smaller. Consequently, the initial running-in can be improved.

The hard carbon coating film according to the present invention has high adhesion in the hard carbon coating film. Consequently, even if the film is formed to have a film thickness of at least 5 μm, the wear resistance can be favorably maintained.

The hard carbon coating film according to the present invention has high adhesion in the hard carbon coating film. Consequently, even if the film is formed to have a film thickness of at least 0.5 μm and less than 5 μm, the wear resistance can be favorably maintained.

BRIEF DESCRIPTION OF DRAWINGS

FIG. 2(a) shows the case where a hard carbon coating film according to this embodiment is formed on a two-piece configuration oil ring; and FIG. 2(b) shows the case where a hard carbon coating film according to this embodiment is formed on a three-piece configuration oil ring.

FIG. 8 is sectional TEM images of coating films showing verification results taken in an under-focus condition by a transmission electron microscope; FIG. 8(a) shows an observation result of Example 1; and FIG. 8(b) shows an observation result of Example 2.

FIG. 9 is diagrams showing verification results of coating film surface states by a confocal microscope; FIG. 9(a) shows an observation result of Example 1; and FIG. 9(b) shows an observation result of Comparison Example 2.

DESCRIPTION OF EMBODIMENTS

Preferred embodiments for implementing the present invention are hereinafter described with reference to the drawings. Note that the following embodiments do not limit the invention according to each claim, and not all combinations of characteristics described in the embodiments are necessarily required for the solution of the invention.

Figure 1:
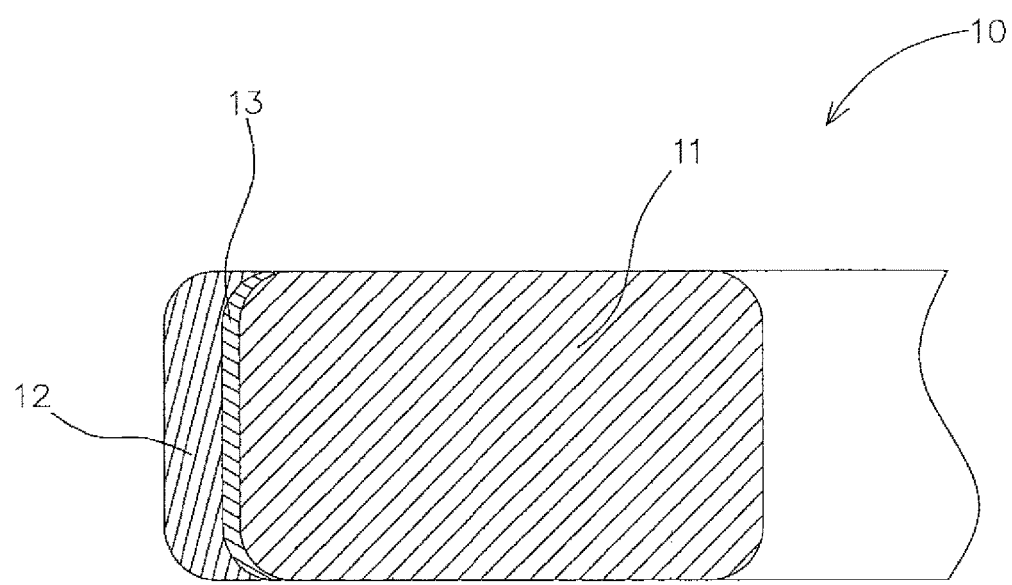
FIG. 1 is a sectional view of a piston ring where a hard carbon coating film according to an embodiment of the present invention is formed.
Figure 3:
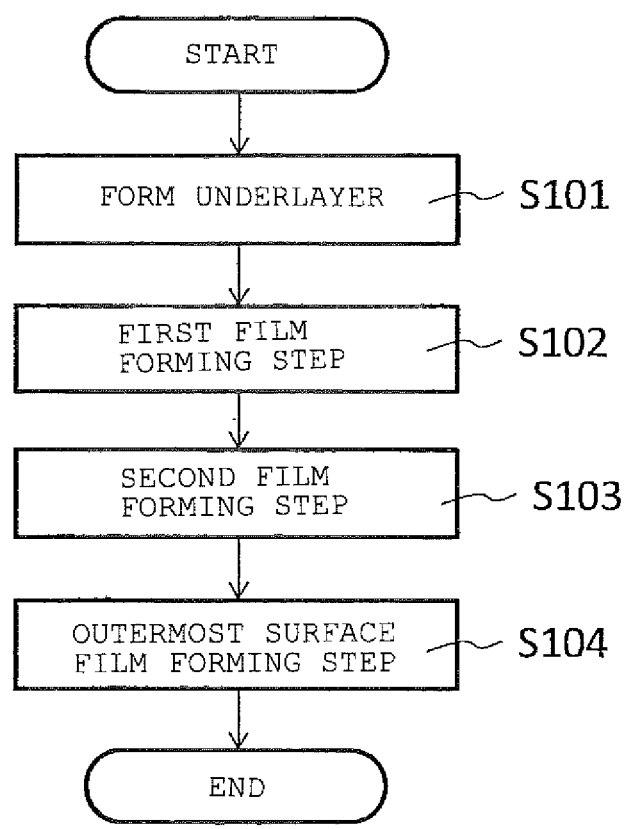
FIG. 3 is a flowchart showing a process of manufacturing the hard carbon coating film according to the embodiment of the present invention.
Figure 4:
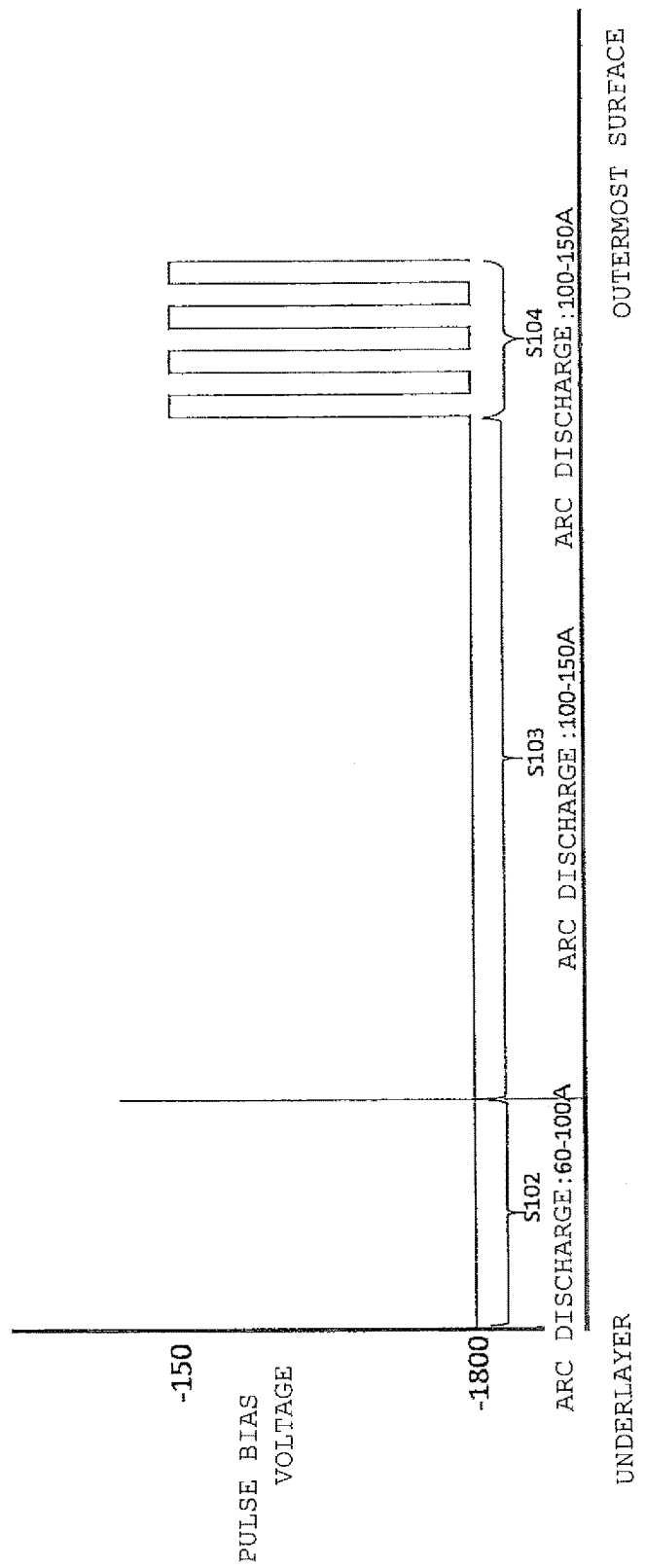
FIG. 4 is a diagram showing variation in arc current and pulse bias voltage according to an ion plating method.
Figure 5:
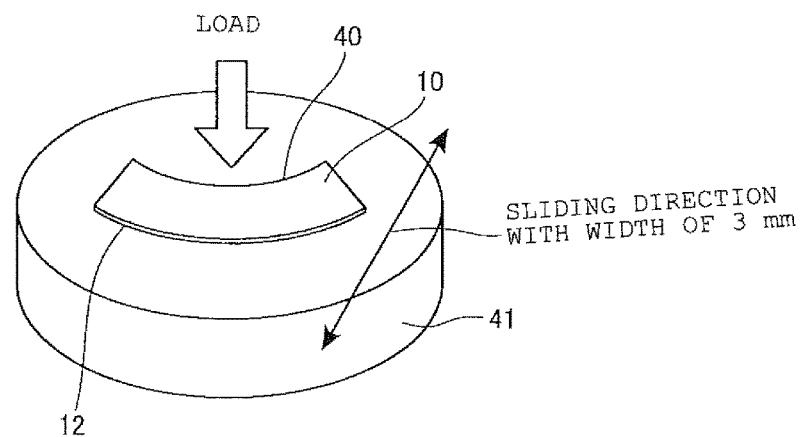
FIG. 5 is a diagram for illustrating an overview of a friction wear test.
Figure 6:
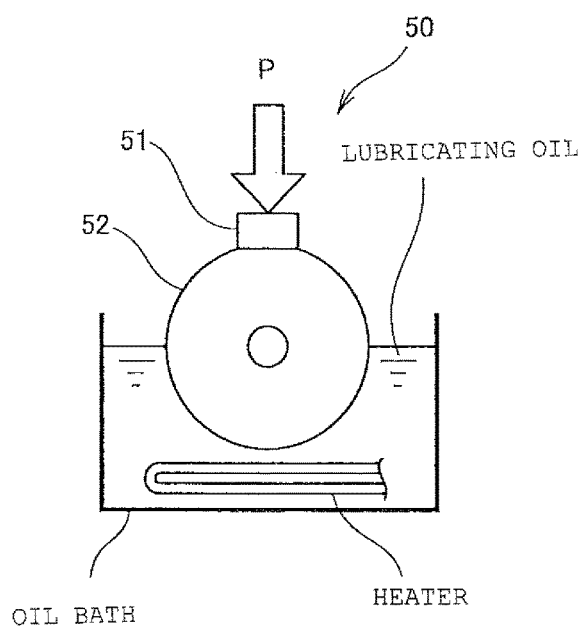
FIG. 6 is a diagram for illustrating an overview of a wear test.
Figure 7:
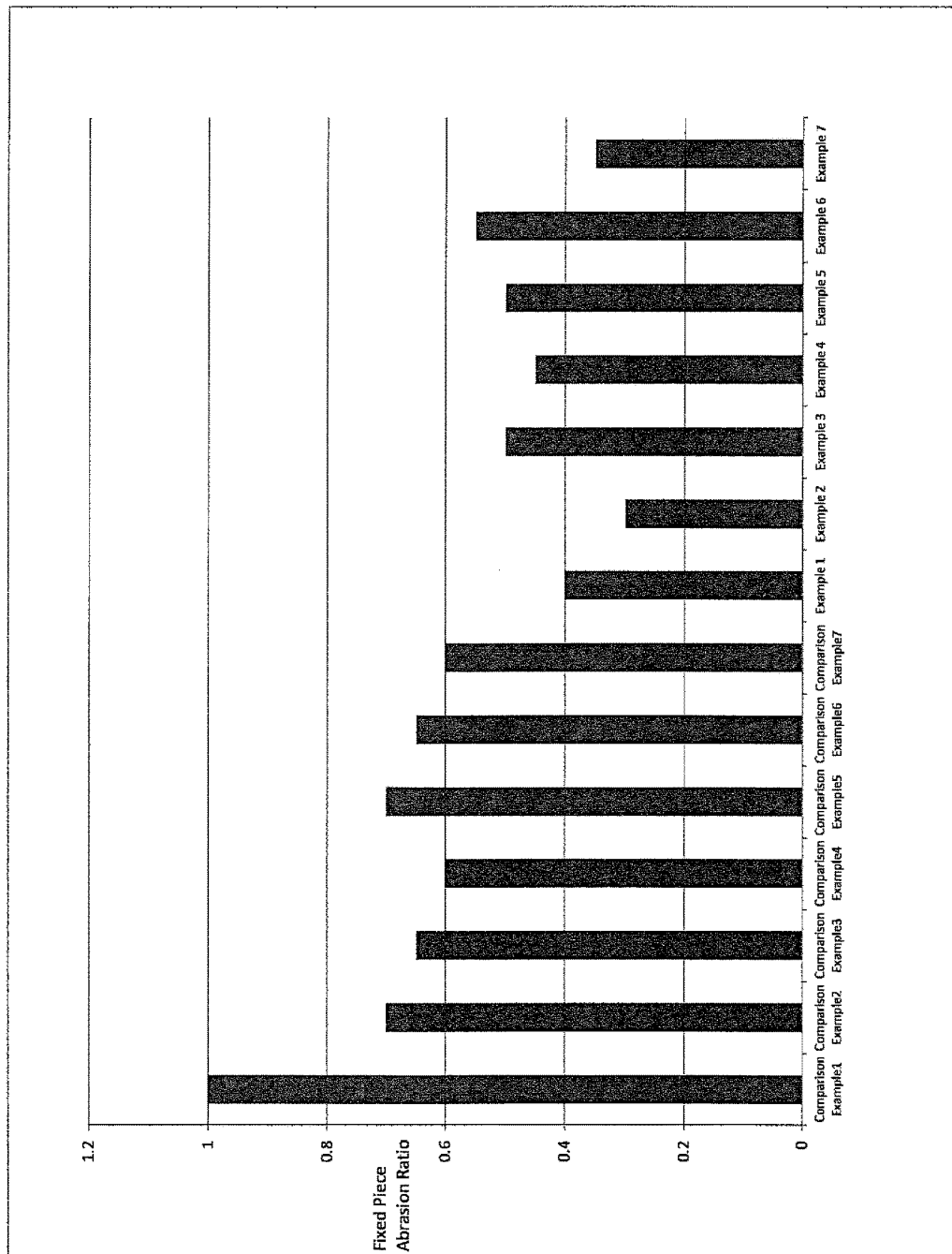
FIG. 7 is a graph showing a test result of the wear test.

FIG. 1 is a sectional view of a piston ring where a hard carbon coating film according to an embodiment of the present invention is formed. FIG. 2(a) shows the case where a hard carbon coating film according to this embodiment is formed on a two-piece configuration oil ring; and FIG. 2(b) shows the case where a hard carbon coating film according to this embodiment is formed on a three-piece configuration oil ring. FIG. 3 is a flowchart showing a process of manufacturing the hard carbon coating film according to the embodiment of the present invention. FIG. 4 is a diagram showing variation in arc current and pulse bias voltage according to an ion plating method. FIG. 5 is a diagram for illustrating an overview of a friction wear test. FIG. 6 is a diagram for illustrating an overview of a wear test. FIG. 7 is a graph showing a test result of the wear test. FIG. 8 is sectional TEM images of coating films showing verification results taken in an under-focus condition by a transmission electron microscope; FIG. 8(a) shows an observation result of Example 1; and FIG. 8(b) shows an observation result of Example 2. FIG. 9 is diagrams showing verification results of coating film surface states by a confocal microscope; FIG. 9(a) shows an observation result of Example 1; and FIG.

Figure 10:
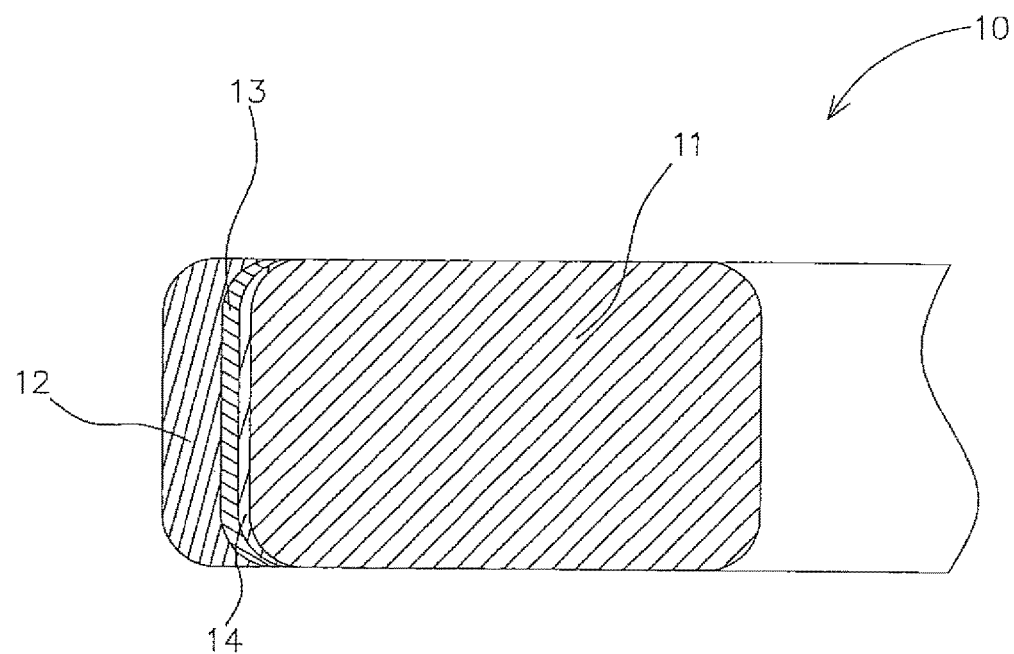
FIG. 10 is a sectional view of a piston ring in the case where a hard carbon coating film according to this embodiment is applied to a piston ring base where a substrate layer is formed.

9(b) shows an observation result of Comparison Example 2. FIG. 10 is a sectional view of a piston ring in the case where a hard carbon coating film according to this embodiment is applied to a piston ring base where a substrate layer is formed.

As shown in FIG. 1, the piston ring 10 where a hard carbon coating film according to this embodiment is formed includes a hard carbon coating film 12 formed at least on an outer sliding surface of a piston ring base 11. An underlayer 13 is formed under the hard carbon coating film 12. Note that the underlayer 13 is not necessarily formed. Formation thereof is optional.

The piston ring 10 where the hard carbon coating film 12 according to this embodiment is formed is a sliding member that is fitted into a piston ring groove formed around a piston, and operates in a reciprocating manner while sliding on the inner surface of a cylinder liner by means of a reciprocating operation of the piston. Note that the piston ring 10 may be used as any of a top ring, a second ring and an oil ring. In the case of applying the hard carbon coating film 12 according to this embodiment to the oil ring, the application may be made to any of oil rings that are a two-piece configuration oil ring including an oil ring main body and a coil expander as shown in FIG. 2(a), and a three-piece configuration oil ring including two side rails and a spacer expander as shown in FIG. 2(b).

The piston ring base 11 may be made of any material only if the material has been conventionally used; the material is not specifically limited. Any piston ring base 11 made of any material may be adopted. Preferably, for example, a stainless steel material, cast material, cast steel material, steel material or the like is adopted. More specifically, it is preferred that a martensitic stainless steel, chrome-manganese steel (SUP9 material), chrome-vanadium steel (SUP10 material), silicon-chrome steel (SWOSC-V material) or the like be adopted. The piston ring base 11 may be made by forming the hard carbon coating film 12 directly on a base material. Alternatively, the hard carbon coating film 12 may be formed on a piston ring base 11 having been subjected to a PDV treatment (Cr—N type, Cr—B—N type, or Ti—N type), a Cr plating treatment or a nitriding treatment. Preferably, the piston ring 10 according to this embodiment is used as a piston ring to be mounted on a piston made of an aluminum alloy. Preferably, this piston ring 10 is used as a piston ring for a cylinder liner made of a cast iron, boron cast iron, cast steel, aluminum alloy or the like. Furthermore, the piston ring base 11 may be subjected to a pretreatment as necessary. Preferably, the pretreatment is surface polishing for adjusting the surface roughness. Preferably, the surface roughness is adjusted by, for example, a method of surface polishing through lapping on the surface of the piston ring base 11 with diamond abrasive grains. Such adjustment of the surface roughness can adjust the surface roughness of the piston ring base 11 within a preferable range from 0.02 to 0.07 µm inclusive in the arithmetic mean roughness Ra in JIS B 0601 (2001).

The hard carbon coating film 12 according to this embodiment is a coating film made of amorphous carbon, contains 0.1 to 5.0 at % hydrogen (H), and the residual consisting of carbon (C) and other unavoidable impurities. The film thickness of the hard carbon coating film 12 according to this embodiment can be a desired film thickness, for example, at least 5 µm.

The reason of containing the aforementioned ratio of H is herein described. This is because H less than 0.1 at % makes film hardness too high and degrades the adhesion, but a content higher than 5.0 at % prevents low friction and wear resistance, which characterize the hard carbon coating film. Note that the hard carbon coating film according to this embodiment has a H content only of about 0.1 to 5.0 at %. Thus, this film is what is called a hydrogen-free hard carbon coating film, which contains substantially no hydrogen in view of the entire hard carbon coating film.

Note that H is contained in the hard carbon coating film by preliminarily containing a minute amount of H in argon gas when the hard carbon coating film is formed in an Ar atmosphere.

In general, the hard carbon coating film is a film that mixedly contains carbon bonds that are $sp^2$ bonds typified by graphite and carbon bonds that are $sp^3$ bonds typified by diamond. Furthermore, the $sp^2$ content ratio represents a content ratio ($sp^2/(sp^2+sp^3)$) of the graphite content ($sp^2$) in hard carbons including the graphite content ($sp^2$) and the diamond content ($sp^3$).

Preferably, the hard carbon coating film 12 according to this embodiment has an $sp^2$ content ratio ranging from 40% to 80% inclusive, which is measured by TEM-EELS where transmission electron microscopy (TEM) and electron energy-loss spectroscopy (EELS) are combined together. An $sp^2$ content ratio less than 40% tends to cause delamination in the hard carbon coating film, which is not preferable. An $sp^2$ content ratio exceeding 80% means graphite. It is thus difficult to form the hard carbon coating film, which is not preferable. More preferably, an $sp^2$ content ratio ranges from 40% to 60% inclusive. Such an $sp^2$ content ratio can be measured by an EELS analyzer (Model 863 GIF Tridem manufactured by Gatan).

The measurement procedures by the TEM-EELS method are as follows. (1) The EELS spectrum is measured by the EELS analyzer. A linear function is fitted to a portion before a peak of the measured EELS spectrum, and a cubic function is fitted to a portion after the peak, thereby normalizing the peak intensity. (2) Subsequently, data on diamond and data on graphite are compared with each other, and the start position of the peak is aligned, thus calibrating energy. (3) An area in a range from 280 to 310 eV in the calibrated data is acquired. (4) In a range from 280 to 295 eV, two peaks are separated (one is a peak of $sp^2$, and the other is a peak of CH or an amorphous component), and a peak area around 285 eV is acquired. (5) The area in the range in (3) from 280 to 310 eV, and the peak area in (4) around 285 eV are thus acquired. In consideration of this area ratio, graphite is assumed to be 100 and diamond is assumed to be zero, and the $sp^2$ content ratio is obtained from relative values. The thus acquired value is adopted as the $sp^2$ content ratio.

Data acquired by the measurement procedures in the case of samples in after mentioned Examples 1 and 2 is represented in the following table. This measurement method adopts three analysis points and calculates an average value.

TABLE 1

| Sample | Analysis Point | 1s→π* Peak Area Around 285 eV | Peak Area (280-310 eV) | Area Ratio | $Sp^2$ Comtent Ratio(%) |
|---|---|---|---|---|---|
| Example1 | 1 | 1.33 | 24.47 | 0.054 | 52 |
|  | 2 | 1.41 | 24.18 | 0.058 | 56 |
|  | 3 | 1.49 | 25.95 | 0.057 | 55 |
| Example2 | 1 | 1.17 | 24.19 | 0.048 | 46 |
|  | 2 | 1.18 | 24.33 | 0.048 | 46 |
|  | 3 | 1.14 | 24.62 | 0.046 | 44 |
| Graphite | — | 2.33 | 23.41 | 0.100 | 100 |
| Diamond | — | 0.11 | 21.91 | 0.005 | 0 |

The initial wear height Rpk that is the surface roughness of the hard carbon coating film 12 according to this embodiment is 0.2 μm or less, which can resultantly improve the initial running-in. At a height exceeding 0.2 μm, surface irregularities increase, which cannot achieve an excellent initial running-in. More preferably, the initial wear height Rpk is 0.15 μm or less.

The area ratio of macro particles on the surface of the hard carbon coating film 12 according to this embodiment ranges from 0.1% to 10.0%, which can resultantly improve the initial running-in and wear resistance. A ratio exceeding 10.0% increases the surface irregularities, and cannot achieve excellent wear resistance. Meanwhile, a ratio less than 0.1% can achieve excellent wear resistance, but film formation itself is difficult, which causes a certain degree of difficulty in manufacturing management and cost. Preferably, the area ratio of macro particles on the surface of the hard carbon coating film 12 ranges from 0.1% to 5.0%.

The area ratio of macro particles on the surface of the hard carbon coating film can be acquired using a confocal microscope (OPTELICS H1200) manufactured by Lasertec Corporation and by image analysis. More specifically, an image of the outer periphery of the piston ring is taken (objective lens of 100×, monochrome confocal image), and automatic binarization is performed. The threshold determination method is according to a discriminant analysis method. Adjustment is performed so as to eliminate polishing scratches and the like, and subsequently the area ratio is extracted from the binarized image. Five points at any positions on the hard carbon coating film are measured, and an average value thereof is acquired.

Furthermore, the hardness (measured from the surface of the coating film) of the hard carbon coating film 12 according to this embodiment ranges from 1500 to 2500 in Vickers hardness Hv. In the case of measurement by a nanoindentation method, the range is from 20 to 30 GPa inclusive. Note that the Vickers hardness can be measured using a micro Vickers hardness tester (manufactured by Akashi Corporation) and the like. The measurement by the nanoindentation method may be made, for example, using a nanoindentation manufactured by Elionix Inc.

On the outermost surface of the hard carbon coating film 12 according to this embodiment, a surface layer nanolaminate portion is formed. The surface layer nanolaminate portion is laminated so as to have a desired thickness. The film is formed to have a total thickness ranging from 0.1 to 2 μm inclusive. In the case of a thickness less than 0.1 μm, improvement in toughness and wear resistance cannot be sufficiently achieved. In the case of a thickness exceeding 2 μm, it takes time to form the film and the cost is high. These cases are thus unfavorable. The thickness of each layer of the surface layer nanolaminate portion approximately ranges from 0.01 to 0.02 μm inclusive. Multiple layers each within this range are stacked to configure the portion. Preferably, the hardness of the outermost surface of the surface layer nanolaminate portion ranges from Hv 1800 to 2800.

The underlayer 13 is made of at least one metal selected from a group consisting of Cr, Ti and Si. As to the hard carbon coating film 12 according to this embodiment, the underlayer 13 is formed under the hard carbon coating film 12. Consequently, the adhesion between the hard carbon coating film 12 and the piston ring base 11 can be improved. Preferably, the underlayer 13 is formed by a sputtering method or an ion plating method. If the film thickness of the hard carbon coating film 12 is formed to be at least 5 μm, it is preferred that the underlayer 13 be formed to have a thickness ranging from 0.1 to 2.0 μm. If the film thickness of the hard carbon coating film 12 is less than 5 μm, it is preferred that the underlayer 13 be formed to have a thickness ranging from 0.05 to 1.0 μm.

Next, a method of manufacturing the hard carbon coating film 12 according to this embodiment is described with reference to FIGS. 2 and 3.

First, the surface of the piston ring base 11 is lapped with diamond abrasive grains to polish this surface such that the surface roughness of the piston ring base 11 is adjusted to be an arithmetic mean roughness Ra in JIS B 0601 (2001) ranging from 0.02 to 0.07 μm.

Subsequently, the base is set through an attachment jig in a chamber, and the chamber is vacuumed. The base is then preheated by a heater, and is subjected to ion cleaning. Argon, which is an inert gas, is introduced, and the underlayer 13 is preliminarily formed on the piston ring base 11 by a sputtering method or an ion plating method (S101).

Subsequently, a shutter for blocking a target is opened to release carbon plasma from the target, and the hard carbon coating film 12 is formed by lamination on the underlayer 13 by an arc ion plating method (S102 to S104).

Note that as to the arc ion plating method, use of a filtered cathodic vacuum arc (FCVA) can reduce macro particles. Note that as the filtering method used for FCVA, a structure (bent structure) may be adopted where a duct type electromagnetic filter is bent between the target and the chamber. The bending may be at one position or two or more positions. Adoption of such a bent mechanism allows macro particles to be stacked on an inner wall of the electromagnetic filter and thus removed, and only the ionized target can be introduced into the chamber.

As shown in FIG. 3, the arc ion plating method includes a first film forming step S102 that performs treatment at an arc current ranging from 60 to 100 A and a pulse bias voltage ranging from −2000 to −800 V, and a second film forming step S103 that performs treatment at an arc current ranging from 100 to 150 A and a pulse bias voltage ranging from −2000 to −800 V. Subsequently, the method further includes an outermost surface film forming step S104 in which while the arc current is maintained at 100 to 150 A, a high voltage treatment at a pulse bias voltage of −2000 to −800 V and a low voltage treatment at a pulse bias voltage of −200 to −100 V are repeated multiple times at predetermined intervals.

The first film forming step S102 is a step applied so as to prevent unsatisfactory adhesion due to rapid increase in arc current and prevent increase of macro particles. The first film forming step S102 causes carbon plasma, applies the pulse bias voltage to the piston ring 10, and forms the hard carbon coating film 12 to have a thickness ranging from 0.1 to 0.5 μm.

The second film forming step S103 is a step of forming the hard carbon coating film 12 to have a desired thickness. The treatment is applied to achieve the desired thickness. Note that the film thickness formed in the second film forming step S103 ranges about 0.5 to 12.0 μm. More preferably, the thickness ranges from 1.0 to 8.0 μm. The hardness of the hard carbon coating film 12 formed in the second film forming step S103 can be about 1700 in Vickers hardness Hv.

The outermost surface film forming step S104 is a step applied to increase the hardness of the outermost surface of the hard carbon coating film 12. The high voltage treatment at a pulse bias voltage ranging from −2000 to −800 V and the low voltage treatment at a pulse bias voltage ranging from −200 to −100 V are switched at intervals ranging from 1 to 10 seconds, and the film is formed. Preferably, the hard carbon coating film 12 is formed to have the hardness of the outermost surface of about 2000 in Vickers hardness Hv after the process of the outermost surface film forming step S104.

The reason of setting the arc current and the pulse bias voltage in the first film forming step S102, the second film forming step S103 and the outermost surface film forming step S104 as the aforementioned ranges is as follows.

In the first film forming step S102, for forming the hard carbon coating film 12, an arc current less than 60 A in the initial film forming is too small arc current and thus the control by arc current is difficult, while an arc current exceeding 100 A results in occurrence of unsatisfactory adhesion due to rapid increase in arc current and results in increase of macro particles.

In the second film forming step S103, after the arc discharge is stabilized by the first film forming step S102, an arc current less than 100 A causes the film forming speed to be small and takes time until the hard carbon coating film 12 is formed to have the predetermined film thickness, while an arc current exceeding 150 A causes occurrence of carbon plasma to be excessive and increases occurrence of macro particles.

Furthermore, as to the pulse bias voltage, if the pulse bias voltage applied to the piston ring base 11 in the single layer is higher than −800 V, a thick film cannot be formed while the wear resistance is maintained. If the voltage is lower than −2000 V, the film forming speed is low, which takes time to form the hard carbon coating film 12 to have the predetermined film thickness.

Moreover, in the outermost surface film forming step S104, if the pulse bias voltage applied to the piston ring base 11 is higher than −100 V, the film stress is low, and a film having low wear resistance is formed. If the pulse bias voltage is lower than −200 V, a thick film cannot be formed while the wear resistance is maintained.

The method of increasing the arc current in transition from the first film forming step S102 to the second film forming step S103 may be stepwise change in a staircase pattern, or linear change along a slope.

EXAMPLES

Next, referring to Examples and Comparison Examples, the present invention is described in further detail.

[Friction Wear Test]

First, on a surface of a piston ring base with φ80 mm (a Cr—N PVD coating film with 25 μm was applied onto the outer peripheral sliding surface of an SWOSC-V material of JIS standards), a Ti layer with 0.3 μm was formed as an underlayer by the ion plating method. A hard carbon coating film was formed on this piston ring base 11 according to the following method, a friction wear test was performed, and presence or absence of wear was observed. Note that the piston ring base contained C: 0.55 mass %, Si: 1.35 mass %, Mn: 0.65 mass %, Cr: 0.70 mass %, Cu: 0.03 mass %, P: 0.02 mass %, S: 0.02 mass %, and the residual: Fe and unavoidable impurities.

Example 1

In the first film forming step (arc current of 90 A, and pulse bias voltage of −1800V), 0.2 μm in 18 min.; in the second film forming step (arc current of 120 A, and pulse bias voltage of −1800 V), 5.2 μm in 456 min.; and thus a hard carbon coating film with the entire film thickness of 5.4 μm was formed.

Example 2

In the first film forming step (arc current 90 A, and pulse bias voltage of −1800 V), 0.2 μm in 18 min.; in the second film forming step (arc current 120 A, pulse bias voltage of −1800 V), 5.2 μm in 456 min.; in the outermost surface film forming step (arc current of 120 A, and pulse bias voltages of −1800 V and −150 V repeated 720 times at intervals of 3 sec.), 0.8 μm; and thus a hard carbon coating film with the entire film thickness of 6.2 μm was formed.

Example 3

In the first film forming step (arc current of 100 A, and pulse bias voltage of −1200 V), 0.5 μm in 41 min.; in the second film forming step (arc current of 150 A, and pulse bias voltage of −1200 V), 11.0 μm in 772 min.; and thus a hard carbon coating film with the entire film thickness of 11.5 μm was formed.

Example 4

In the first film forming step (arc current of 100 A, and pulse bias voltage of −1200 V), 0.5 μm in 41 min.; in the second film forming step (arc current of 150 A, and pulse bias voltage of −1200 V), 11.0 μm in 772 min.; in the outermost surface film forming step (arc current of 150 A, and pulse bias voltages of −1200 V and −100 V repeated 720 times at intervals of 3 sec.), 1.0 μm; and thus a hard carbon coating film with the entire film thickness of 12.5 μm was formed.

Example 5

In the first film forming step (arc current of 60 A, and pulse bias voltage of −2000 V), 0.1 μm in 14 min.; in the second film forming step (arc current of 100 A, and pulse bias voltage of −2000 V), 1.0 μm in 105 min.; in the outermost surface film forming step (arc current 140 A, and pulse bias voltages of −2000 V and −200 V repeated 720 times at intervals of 3 sec.), 1.0 μm; and thus a hard carbon coating film with the entire film thickness of 2.1 μm was formed.

Example 6

In the first film forming step (arc current of 100 A, and pulse bias voltage of −2000 V), 0.5 μm in 41 min.; in the second film forming step (arc current of 150 A, and pulse bias voltage of −2000 V), 4.0 μm in 281 min.; and thus a hard carbon coating film with the entire film thickness of 4.5 μm was formed.

Example 7

In the first film forming step (arc current of 60 A, and pulse bias voltage of −1200 V), 0.1 μm in 14 min.; in the second film forming step (arc current of 150 A, and pulse bias voltage of −1200 V), 1.0 μm in 70 min.; and thus a hard carbon coating film with the entire film thickness of 1.1 μm was formed.

Comparison Example 1

In the sputtering method (power of 3000 W, and pulse bias voltage of −150 V), DLC with low hardness and a thickness of 0.045 μm in 75 min.; in the arc ion plating method (arc current of 120 A, and pulse bias voltage of −150 V), DLC with high hardness and a thickness of 0.45 µm in 39 min., and two layers with a thickness of 0.495 µm were laminated 11 times to form a hard carbon coating film with a film thickness of 5.45 µm.

Comparison Example 2

In the arc ion plating method (arc current of 90 A, and pulse bias voltage of −200 V), a hard carbon coating film with a film thickness of 1.0 µm was formed in 90 min.

Comparison Example 3

In the first film forming step (arc current of 120 A, and pulse bias voltage of −1200 V), 0.5 µm in 34 min.; in the second film forming step (arc current of 150 A, and pulse bias voltage of −1200 V), 5.1 µm in 358 min.; and thus a hard carbon coating film with the entire film thickness of 5.6 µm was formed.

Comparison Example 4

In the first film forming step (arc current of 100 A, and pulse bias voltage of −200 V), 0.2 µm in 16 min.; in the second film forming step (arc current of 150 A, and pulse bias voltage of −200 V), 5.5 µm in 386 min.; and thus a hard carbon coating film with the entire film thickness of 5.7 µm was formed.

Comparison Example 5

In the first film forming step (arc current of 100 A, and pulse bias voltage of −3000 V), 0.2 µm in 16 min.; in the second film forming step (arc current of 150 A, and pulse bias voltage of −3000 V), 5.2 µm in 365 min.; and thus a hard carbon coating film with the entire film thickness of 5.4 µm was formed.

Comparison Example 6

In the first film forming step (arc current of 60 A, and pulse bias voltage of −3000 V), 0.1 µm in 14 min.; in the second film forming step (arc current of 100 A, and pulse bias voltage of −3000 V), 5.0 µm in 526 min.; and thus a hard carbon coating film with the entire film thickness of 5.1 µm was formed.

Comparison Example 7

In the first film forming step (arc current of 60 A, and pulse bias voltage of −300 V), 0.1 µm in 14 min.; in the second film forming step (arc current of 100 A, and pulse bias voltage of −300 V), 5.2 µm in 547 min.; and thus a hard carbon coating film with the entire film thickness of 5.3 µm was formed.

The tests were performed in the following conditions.

The amount of hydrogen content of the hard carbon coating film was 0.3 at %. The piston ring was cut in a length of 20 mm, and used as a test piece 40 on a sliding side (pin type test piece).

A test piece 41 on the opposite side (disk type test piece) that is made of SUJ2 steel defined in JIS G4805 as a high carbon chromium bearing steel material, and has a dimension of φ 24×7.9 mm and at least a hardness of HRC62 or higher was used as the test piece 41 on the opposite side, and an SRV test in the following conditions was performed as shown in FIG. 5.

Test instrument: SRV test instrument
Load: 100 N, 200 N, 300 N
Frequency: 50 Hz
Test temperature: 80° C.
Sliding width: 3 mm
Lubricating oil: 5W-30, 125 ml/hr
Test time: 10 min.

As shown in Table 2, according to the test result, wear was observed at a load of 200 N or higher in Comparison Example 1, and at a load of 300 N or higher in Comparison Example 2, while no were was identified even at a load of 300 N in Examples 1 to 7 and favorable wear resistance was verified. In Table 2, "○" indicates that no wear was identified.

TABLE 2

| Load (N) | Comparison Example 1 | Comparison Example 2 | Example 1 | Example 2 | Example 3 | Example 4 | Example 5 | Example 6 | Example 7 |
|---|---|---|---|---|---|---|---|---|---|
| 100 | ○ | ○ | ○ | ○ | ○ | ○ | ○ | ○ | ○ |
| 200 | Abrasion | ○ | ○ | ○ | ○ | ○ | ○ | ○ | ○ |
| 300 | Abrasion | Abrasion | ○ | ○ | ○ | ○ | ○ | ○ | ○ |

[Wear Test]

Next, using the aforementioned Examples 1 to 7 and Comparison Examples 1 to 7, wear tests were performed. As shown in FIG. 6, for the wear tests, an Amsler-type wear tester 50 was used. As to used samples 51, Examples 1 and 2 and Comparison Examples 1 and 2 were adopted as fixed pieces with 7 mm×8 mm×5 mm, and a toroidal piece (outer diameter of 40 mm, inner diameter of 16 mm, and thickness of 10 mm) was used as an opposite piece 52 (rotating piece). The sample 51 and the opposite piece 52 were brought into contact with each other, a load P is applied, the test was performed in the following test condition, and the abrasion ratio of the fixed piece was measured.

Test instrument: Amsler-type wear tester Lubricating oil: 0 W-20
Oil temperature: 80° C.
The number of revolutions: 1.0 m/s
Load: 784 N
Test time: 7 hours
Opposite piece: boron cast iron As shown in FIG. 7, the test results verified that Examples 1 and 2 have a significantly lower abrasion ratio by 30% to 40% than Comparison Example 1, and thus verifying that the wear resistance was significantly favorable. Furthermore, it was also verified that Examples 3 to 7 have lower abrasion ratios than Comparison Examples 1 to 7.

[Transmission Electron Microscopic Observation Test]

Next, using the aforementioned Examples 1 and 2 and Comparison Example 2, an observation test by a transmission electron microscope (TEM) was performed.

First, sectional TEM images of coating films of Examples 1 and 2 were observed. The sectional TEM images of coating films were observed by shade comparison in an under-focus condition. As a result, as shown in FIG. 8(a), it was verified that the sectional state of Example 1 showed a configuration of a homogeneous film with a small contrast. Since Example 1 thus included the homogeneous film, it was verified that the wear resistance of the film was excellent.

As shown in FIG. 8(b), the surface layer nanolaminate portion formed on the outermost surface of Example 2 was observed to have a striped contrast state. It is believed that the bright contrast portion was a portion that had a low density and allowed many electron beams to be transmitted, and the dark contrast portion was a portion that had a high density and allowed only a few electron beams to be transmitted. Such striped contrast appeared because the high voltage treatment and the low voltage treatment with pulse bias voltages of −150 and −1800 V were repeated multiple times at predetermined intervals to form the surface layer nanolaminate portion. According to the surface layer nanolaminate portion, improvement in toughness and wear resistance was verified.

Next, the surface states of Example 1 and Comparison Example 2 were observed. As shown in FIG. 9(a), it was verified that Example 1 has a much smaller amount of macro particles than Comparison Example 2 shown in FIG. 9(b). Note that dark portions in FIGS. 9(a) and 9(b) are at positions where macro particles were observed. In consideration of this observation result, the ratio of area of dark portions in the entire area was calculated, thus calculating the area ratio of macro particles. The calculation method was calculation through image analysis using the confocal microscope. Furthermore, the $sp^2$ content ratio was calculated by measurement using the TEM-EELS.

The initial wear heights Rpk, which were the surface roughnesses of Examples 1 to 7 and Comparison Examples 1 to 7, were measured according to DIN 4776 standards.

The following Table 3 summarizes the verification results of these area ratios of macro particles, $sp^2$ content ratios, and initial wear heights Rpk.

TABLE 3

| | Macro Particle Area Ratio (%) | $Sp^2$ Comtent Ratio(%) | Fixed Piece Abrasion Ratio | Initial Wear Height Rpk (μm) |
|---|---|---|---|---|
| Example 1 | 1.8 | 54 | 0.4 | 0.08 |
| Example 2 | 1.5 | 45 | 0.3 | 0.08 |
| Example 3 | 9.5 | 47 | 0.5 | 0.14 |
| Example 4 | 9 | 41 | 0.45 | 0.13 |
| Example 5 | 0.15 | 73 | 0.5 | 0.05 |
| Example 6 | 9 | 75 | 0.55 | 0.15 |
| Example 7 | 0.18 | 44 | 0.35 | 0.05 |
| Comparison Example 1 | 13.2 | 73 | 1 | 0.16 |
| Comparison Example 2 | 34.3 | 10 | 0.7 | 0.21 |
| Comparison Example 3 | 15.6 | 41 | 0.65 | 0.17 |
| Comparison Example 4 | 9.8 | 25 | 0.6 | 0.19 |
| Comparison Example 5 | 9.4 | 84 | 0.7 | 0.18 |
| Comparison Example 6 | 0.21 | 86 | 0.65 | 0.07 |
| Comparison Example 7 | 0.17 | 23 | 0.6 | 0.06 |

As shown above, it was verified that in Example 1 to 7, the macro particle area ratios were within a range from 0.1% to 10.0%, and the $sp^2$ content ratios were within a range from 40% to 80%. It was verified that in Comparison Examples 1 to 3, the macro particle area ratios had a large value of at least 13.2%, which exceeded 10.0%. It was also verified that in Comparison Examples 2 and 4 to 7, the $sp^2$ content ratios were out of a range from 40% to 80%. Furthermore, the fixed piece abrasion ratios in Examples 1 to 7 showed lower values than the fixed piece abrasion ratios in Comparison Examples 1 to 7. It was thus verified that the hard carbon coating films having a macro particle area ratio ranging from 0.1% to 10.0% and an $sp^2$ content ratio ranging from 40% to 80% had high wear resistance.

Moreover, Example 1 to 7 had an initial wear height Rpk of 0.2 μm or smaller. It was thus verified that a synergistic effect of the configuration having the macro particle area ratio and $sp^2$ content ratio exhibited further wear resistance.

As described above, based on the verification results through the transmission electron microscope, the differences between structures of Examples 1 to 7 and Comparison Examples 1 to 7 were verified.

The hard carbon coating film 12 according to this embodiment has been described on the cases of formation having a film thickness of at least 5 μm. The film thickness is not limited to these cases. For example, the film may be formed to have a thickness of at least 0.5 μm and less than 5 μm. In the case of forming such a thin film, formation of a substrate layer 14 including any of a PVD coating film, a Cr plating coating film or a nitrided layer between the underlayer 13 and the piston ring base 11 as shown in FIG. 10 can further improve the adhesion of the hard carbon coating film 12.

The aforementioned hard carbon coating films 12 according to this embodiment have been described on the cases where the hard carbon coating film and the like were formed only on the outer peripheral sliding surface of the piston ring 10. Alternatively, the hard carbon coating film 12 and the like may be formed continuously on the upper surface, lower surface and inner surface of the piston ring base. It is apparent, from the description of Claims, that modes with such change or improvement also encompassed within the technical scope of the present invention.

REFERENCE SIGNS LIST

10 Piston ring, 11 Piston ring base, 12 Hard carbon coating film, 13 Underlayer, 14 Substrate layer.

The invention claimed is:
1. A hard carbon coating film formed at least on an outer peripheral sliding surface of a piston ring base and containing substantially no hydrogen,
wherein the hard carbon coating film has an $sp^2$ content ratio, between graphite content in hard carbons of the hard carbon coating and diamond content of the hard carbon coating, ranging from 40% to 80% measured in a TEM-EELS spectrum where transmission electron microscopy (TEM) and electron energy-loss spectroscopy (EELS) are combined together, and an area ratio of contained macro particles on a surface of the hard carbon coating film ranges from 0.1% to 10.0%, the area ratio representing a ratio between area in a range from 280 to 310 eV of the TEM-EELS spectrum and a peak area around 285 eV of the TEM-EELS spectrum, and
wherein the hard carbon coating film includes a surface layer nanolaminate portion having a striped coating film section on an outermost surface of the hard carbon coating by the TEM.

2. The hard carbon coating film according to claim 1,
wherein the film is formed in a step of changing an intensity of arc current, the step including a first film forming step of performing treatment at an arc current ranging from 60 to 100 A and a pulse bias voltage ranging from −2000 to −800 V, and a second film forming step of performing treatment at an arc current ranging from 100 to 150 A and a pulse bias voltage ranging from −2000 to −800 V.

3. The hard carbon coating film according to claim 1,
wherein the surface layer nanolaminate portion further includes an outermost surface film forming step of repeating a high voltage treatment at a pulse bias voltage ranging from −2000 to −800 V and a low voltage treatment at a pulse bias voltage ranging from −200 to −100 V multiple times at predetermined intervals after the second film forming step.

4. The hard carbon coating film according to claim 1,
wherein an underlayer including Ti, Cr or Si is provided under the hard carbon coating film.

5. The hard carbon coating film according to claim 4,
wherein a substrate layer including any of a PVD coating film, a Cr plating coating film and a nitrided layer is formed between the underlayer and the piston ring base.

6. The hard carbon coating film according to claim 1,
wherein the hard carbon coating film has a surface roughness of an initial wear height Rpk according to DIN 4776 standards of 0.2 μm or smaller.

7. The hard carbon coating film according to claim 1,
wherein the hard carbon coating film is formed to have a film thickness of at least 5 μm.

8. The hard carbon coating film according to claim 1,
wherein the hard carbon coating film is formed to have a film thickness of at least 0.5 μm and less than 5 μm.

* * * * *